United States Patent [19]
Moslehi et al.

[11] Patent Number: 5,256,563
[45] Date of Patent: Oct. 26, 1993

[54] DOPED WELL STRUCTURE AND METHOD FOR SEMICONDUCTOR TECHNOLOGIES

[75] Inventors: Mehrdad M. Moslehi; John W. Kuehne, both of Dallas, Tex.

[73] Assignee: Texas Instruments Incorporated, Dallas, Tex.

[21] Appl. No.: 869,423

[22] Filed: Apr. 16, 1992

[51] Int. Cl.⁵ ............... H01R 21/22; H01L 21/302
[52] U.S. Cl. ............................ 437/152; 437/56; 437/61; 437/46; 437/228; 148/DIG. 112
[58] Field of Search ............... 437/152, 56, 57, 241, 437/94, 27

[56] References Cited

U.S. PATENT DOCUMENTS

| | | | |
|---|---|---|---|
| 4,786,609 | 11/1988 | Chen | 437/241 |
| 4,904,613 | 2/1990 | Coe et al. | 437/27 |
| 4,968,639 | 11/1990 | Bergonzoni | 437/57 |

OTHER PUBLICATIONS

M. M. Moslehi et al., "Compositional Studies of Thermally Nitrided Silicon Dioxide (Nitroxide)", *J. Electrochem. Soc.: Solid-State Science and Technology*, vol. 132, No. 9, Sep. 1985, pp. 2189-2197.

M. M. Moslehi et al., "Thermal Nitridation of Si and SiO₂ for VLSI", *IEEE Transactions on Electron Devices*, vol. Ed-32, No. 2, Feb. 1985, pp. 106-123.

M. M. Moslehi et al., "Rapid thermal nitridation of SiO₂ for nitroxide thin dielectrics", *Appl. Phys. Lett. 47*, vol. 47, No. 10, Nov. 15, 1985, pp. 1113-1115.

Primary Examiner—Olik Chaudhuri
Assistant Examiner—H. Jey Tsai
Attorney, Agent, or Firm—Ira S. Matsil; James C. Kesterson; Richard L. Donaldson

[57] ABSTRACT

A method of forming doped wells 24 and 30 in a semiconductor layer is disclosed herein. In a preferred embodiment, an oxide layer 16 is formed on the surface of a silicon layer 14. A nitride layer 18 is then formed on the oxide layer 16 and is patterned and etched to define a first well region 24. The first well region 24 is then doped, for example with phosphorus or boron. A resist layer 26 is formed over the first well region 24 and over a portion of the nitride layer 18 after which a portion of the nitride layer 18 not beneath the resist layer 26 is removed to expose a second well region 30. The second well region 30 is then doped. After the remaining portion the resist layer 26 is removed, an oxide layer 32 is formed over the first 24 and second 30 well regions while the surface 38 over the region 36 separating the well regions is left bare. The semiconductor wafer 10 is then heated in a nitridizing environment (e.g., ammonia ambient) such that dopants tend to diffuse into the silicon layer 14 with enhanced vertical diffusivities but reduced lateral diffusivities.

19 Claims, 4 Drawing Sheets

DOPED WELL STRUCTURE AND METHOD FOR SEMICONDUCTOR TECHNOLOGIES

This invention was made with government support under contact no. F33615-88-C-5448 awarded by the United States Air Force. The government may have certain rights in this invention.

FIELD OF THE INVENTION

This invention generally relates to the fabrication of semiconductor devices and specifically to a method for forming well structures in a semiconductor layer.

BACKGROUND OF THE INVENTION

Advanced CMOS (complementary metal-oxide-semiconductor) and BiCMOS (bipolar and complementary metal-oxide-semiconductor), as well as some other device technologies, require the formation of doped N or P wells or both N and P wells in bulk silicon or epitaxial (for example, a P− epi-layer on a P+ substrate or an N− epi-layer on an N+ substrate) wafers. The well formation process is usually based on ion implantation of boron (for P-well) or phosphorus (for N-well) followed by a long (e.g., a few hours), high-temperature (e.g., 1100° to 1200° C.) furnace anneal in an inert (argon or nitrogen) or oxidizing (oxygen or steam) ambient.

The relatively long furnace anneal process is required to form relatively deep N and P well regions via thermal diffusion. The well junction depth is usually at least a few times larger than the source/drain junction depths. For instance, a $0.35\mu m$ CMOS technology may require N and P wells with greater than one micron well-to-substrate junction depth.

If the well formation process is to be performed using a single-wafer processing, the time and temperature requirements for a single-wafer well drive-in process can be rather excessive (e.g., temperatures of 1100°-1200° C. for more than 30 min.) resulting in low manufacturing throughput. This requirement could increase the manufacturing costs.

Moreover, conventional furnace diffusion processes for formation of diffused wells cause lateral diffusion of both N and P dopants, resulting in lateral dopant compensation. This undesirable lateral diffusion places a limit of the minimum N-to-P well spacing and makes device layout scaling more difficult.

As a result, there is a need for an RTP (rapid thermal processing) based well formation process which can form the necessary N and P well regions using reasonable RTP temperature/time conditions. Moreover, there is a need for a well formation process which can form the wells of desired depths using reduced temperature/time process parameters without excessive lateral interdiffusion of the N and P well dopants.

SUMMARY OF THE INVENTION

Other objects and advantages will be obvious, and will in part appear hereinafter and will be accomplished by the present invention which provides a method and structure for a semiconductor well.

A method of forming doped wells in a semiconductor layer (e.g., epitaxial layer or substrate) is disclosed herein. A first doped well region is formed in the semiconductor layer adjacent a separation region. An oxide layer (e.g., silicon dioxide) is formed over the first doped well region but not over the separation region. The semiconductor layer is then heated in a nitridizing environment such that dopants in the doped well region diffuse vertically at a higher rate than the dopants diffuse laterally. The method can be expanded to include forming a second doped well region in the semiconductor layer.

In a preferred embodiment, an oxide layer is formed on the surface of a silicon layer. A nitride layer is then formed on the oxide layer and is patterned and etched to define a first well region. The first well region is then doped, for example with phosphorus or boron. A resist layer is formed over the first well region and over a portion of the nitride layer after which a portion of the nitride layer not beneath the resist layer is removed to expose a second well region. The second well region is then doped. After the remaining portion of the resist layer is removed, an oxide layer is formed over the first and second well regions while the surface over the region separating the well regions is masked by the remaining portion of the nitride layer. The layer is then heated in a nitridizing environment (e.g., ammonia ambient) such that dopants diffuse at an enhanced vertical rate into the silicon layer.

One advantage of the invention is that dopants tend to diffuse into the semiconductor layer at a greater rate than they diffuse laterally. Therefore, significant lateral counter doping is avoided and higher quality devices may be fabricated in reduced substrate area.

In addition, this invention can be utilized in either multi-wafer or single-wafer processing chambers. The reasonable time (e.g., less than ten minutes) and temperature (e.g., less than 1150° C.) requirements make the process practical in a high-volume manufacturing environment. This is especially true for single-wafer processing equipment where the processing time per wafer is critical since wafers are processed one at a time.

A further advantage of this invention is that the process flow may be modified so that both the N-well and P-well regions are formed without producing any substantial nonplanar topography or steps on the substrate. A planar device structure is typically preferred for subsequent microlithography steps and uniform linewidth control.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

Figure 1:
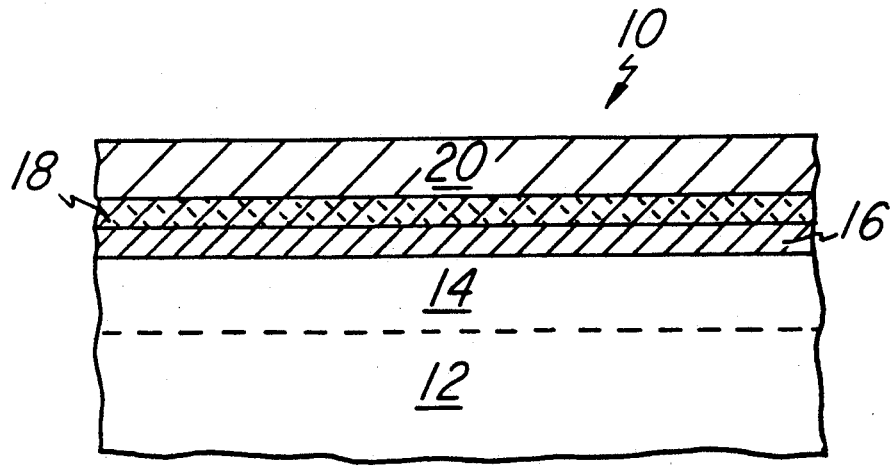
FIGS. 1 through 7 are cross-sectional views of an exemplary embodiment device during various stages of the process flow.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The present invention is related to co-pending application Ser. No. 07/856,008 filed on Mar. 20, 1992.

The following is a description of the structure and method of the present invention. The preferred embodiment will be described first followed by a description of modifications. An application example will then be briefly described.

The following is a description of the structure and method of the present invention. The preferred embodiment will be described first followed by a description of modifications. An application example will then be briefly described.

The present invention proposes a useful and practical process based on RTP (rapid thermal processing) or standard furnace processing which can be used to form N and/or P wells for technologies such as advanced submicron CMOS (complementary metal-oxide-semiconductor) or BiCMOS (bipolar and complementary metal-oxide-semiconductor on same chip) technologies. The process flow described herein allows optimization of the CMOS wells without any need for MeV (mega-electron-volt) or very high energy ion implantation steps and without significant process throughput limitation problems.

In one aspect, the process utilizes two main features. The first feature is an effect known as "oxynitridation-enhanced diffusion" or "ONED." This effect is used during the RTP well drive-in cycle to cause a significant enhancement of the boron and phosphorus diffusivities in the vertical direction. This effect can be stronger than the so-called "oxidation-enhanced diffusion" or "OED" effect for boron and phosphorus and allows for a reduction in the well diffusion time and temperature requirements. Further, the OED method is not typically considered desirable in submicron technologies since silicon is consumed through thermal oxidation. The ONED effect on the other hand consumes only a negligible amount of silicon.

Another effect known as "nitridation-retarded diffusion" or "NRD" is also utilized. This effect is used in order to minimize the lateral diffusivities of boron and phosphorus during the RTP well formation. This will allow closer spacings between N and P wells due to reduced lateral dopant compensation and reduced lateral N and P well diffusions.

For more information on NRD, ONED, rapid thermal oxidation, and nitridation, see the following papers:
1) Moslehi et al. "Thermal Nitridation of Si and $SiO_2$ for VLSI", *IEEE Transactions on Electron Devices*, Vol. ED-32, No. 2, February 1985, pp. 106–123.
2) Moslehi et al. "Compositional Studies of Thermally Nitrided Silicon Dioxide (Nitroxide)", *Journal of the Electrochemical Society*, Vol. 132, No. 9, September 1985, pp. 2189–2197.
3) Moslehi et al. "Rapid Thermal Nitridation of SiO2 for Nitroxide Thin Dielectrics", *Appl. Phys. Lett.* 47 (10), 15 Nov. 1985, pp. 1113–1115.

The RTP and standard furnace based CMOS well formation process proposed herein is fully compatible with standard CMOS and BiCMOS technologies. The electrical characteristics of the wells (e.g., crystal quality) are as good as those of the conventional CMOS wells. The process flow described herein utilizes two masks to form both the N and P wells. For the specific embodiment described in detail, a twin-cell CMOS technology is assumed even though the process may also be used for a wide variety of other technologies.

For the example used to describe the process flow, it is assumed that both N and P wells are formed on $P^-$-epi/$P+$ substrate wafers. The use of epitaxial material is known to be very helpful for CMOS latch-up immunity. To describe the proposed flow, it is assumed that the object is to form 1.0 to 1.5 $\mu$m deep wells on $P^-$/$P+$ epitaxial wafers. Typically the epitaxial layer thickness is between 2 and 4 microns.

Although described with respect to a specific embodiment, the present invention may be performed in a variety of environments. For example, the substrate may be bulk silicon or an epitaxial grown layer grown on bulk semiconductor or on an insulator such as any of the known SOI (semiconductor or insulator technologies). In addition, the process may be performed in a single wafer or multi-wafer processing equipment.

The process steps of the preferred embodiment will now be described with respect to FIGS. 1 through 7. Alternate process steps are also described with respect to FIGS. 8 and 9. A cross sectional view of an exemplary application will then be shown in FIG. 8.

Referring first to FIG. 1, a semiconductor workpiece 10 comprises a $P+$ silicon substrate 12 over which $P-$ epitaxial layer 14 is formed. As previously mentioned, the doping of the workpiece may vary (e.g., P-type, N-type, intrinsic) depending upon the application and device/process requirements.

An oxide layer 16 is formed on the surface of layer 14. In the preferred embodiment, the oxide layer 16 comprises silicon dioxide and is formed by thermal oxidation. The oxide layer 14 may also be formed by LPCVD (low-pressure chemical-vapor deposition) or PECVD (plasma-enhanced chemical-vapor deposition). The oxide layer 16 is typically between about 100 and 1000 Å thick and preferably about 250 Å thick.

The next step of the preferred process flow is to form silicon nitride ($Si_3N_4$) layer 18 over oxide layer 16. The nitride layer 18 is typically formed by chemical vapor deposition and is typically between about 300 Å and 1300 Å thick.

A resist layer 20 is then formed over nitride layer 18. The resist layer 20 may be any standard microlithography resist as is well known in the art.

Figure 2:
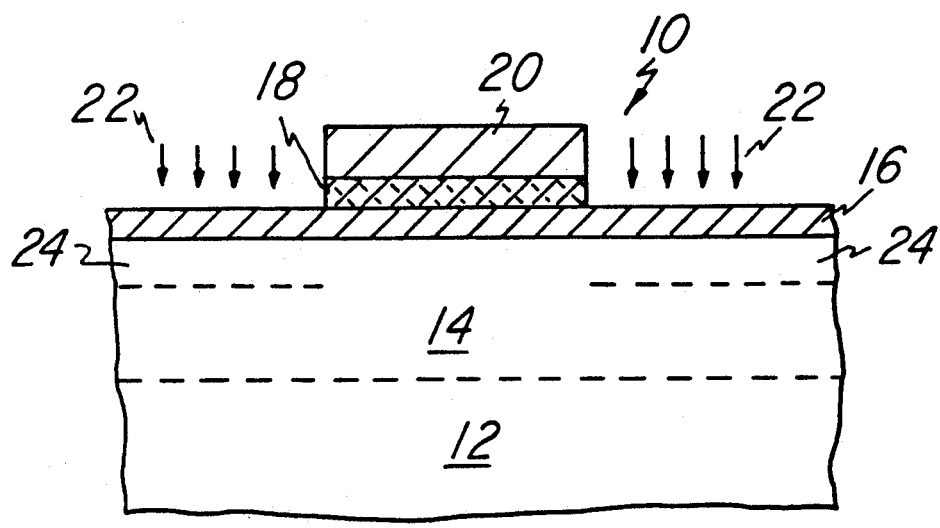

Referring now to FIG. 2, a first microlithography mask is used to define the first well regions. The resist layer 20 is patterned and developed as is well known in the art.

Using the pattern formed in resist layer 20, nitride layer 18 is then etched with either an isotropic or an anisotropic plasma etch. During this etch process, the oxide layer 16 will serve as an etch stop. During this process, the second well region as well as a separation region (i.e., an unimplanted region that separates the first and second well regions) are masked beneath nitride layer 18 and resist layer 20.

The next step is to perform the first masked well region implantation. For the example illustrated herein, this will be the N well implantation. This step is illustrated in FIG. 2 by the arrows 22. Typically, but not necessarily, this is a double or multiple implants at various doses and energies. For example, it alternatively may be a single or triple implant. The most common N type dopant for wells is phosphorus but other N-type dopants such as arsenic and antimony may also be used. Phosphorus is preferred due to its much higher diffusivity compared to arsenic and antimony. The implanted region in layer 14 is denoted by the dashed lines and the numeral 24.

Figure 3:
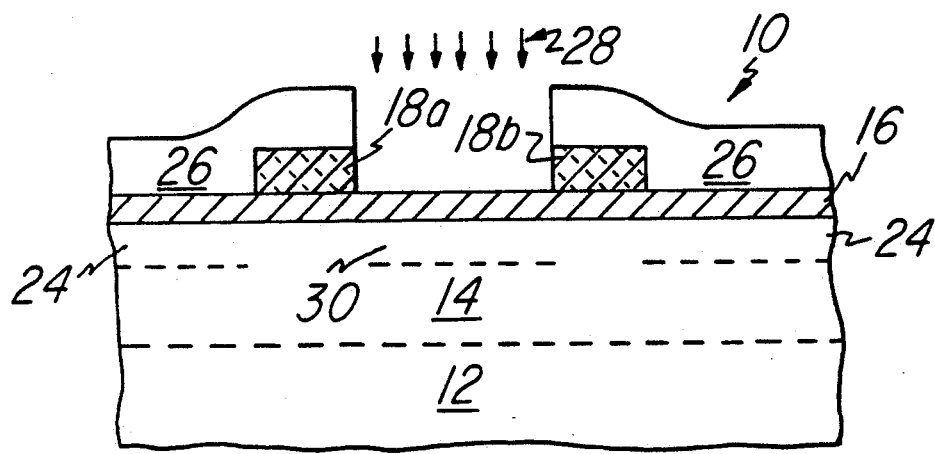

Referring next to FIG. 3, the resist layer 20 is removed. For example, resist layer 20 may be removed using an ash process. A resist layer 26 is then formed and patterned to define the second well regions.

The portion of nitride layer 18 exposed by the second photoresist mask 26 is then etched away. It is noted that the portions of nitride remaining 18a and 18b are left over the separation regions between the first and second well regions.

The next step is to perform the second well region implantation. In the example illustrated here, the second well region is a P well region. This step is illustrated in FIG. 3 by the arrows 28. Typically, but not necessarily, this doping step also comprises a double or multiple implants. For example, the step may alternatively be a single or a triple implant. The preferred p-type dopant is boron but other dopants such as aluminum or gallium may also be used. In FIG. 3, the second implanted region in layer 14 is denoted by the dashed lines and the numeral 30.

Although discussed herein as a N-well region 24 and a P-well region 30, the regions 24 and 30 may both be N-well regions (e.g., with different doping concentrations) or both be P-well regions as required by the specific application. Of course, the region 24 may be doped with p-type impurities and the region 30 with n-type impurities.

Figure 4:
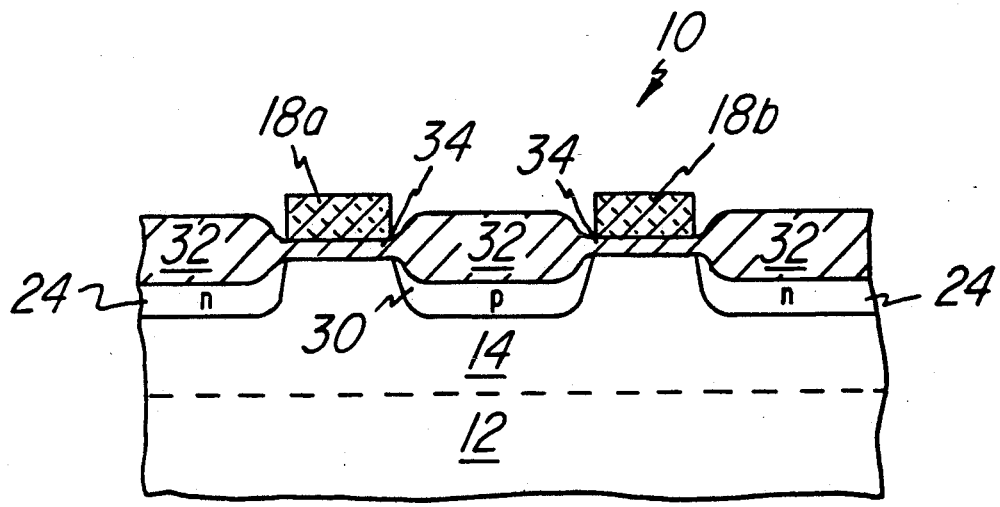

Referring next to FIG. 4, the resist layer 26 is stripped. A short steam oxidation is then performed to increase the thickness of the exposed portions of oxide layer 16. These exposed portions of thicker oxide are denoted in FIG. 4 with the reference numeral 32. The portions of initial oxide layer 16 beneath nitride layer 18 are denoted with the numeral 34. The thermal process used for the oxidation may be a rapid thermal process or a standard furnace process. The thicker oxide regions 32 will typically be between 400 Å and 1000 Å thick.

Figure 5:
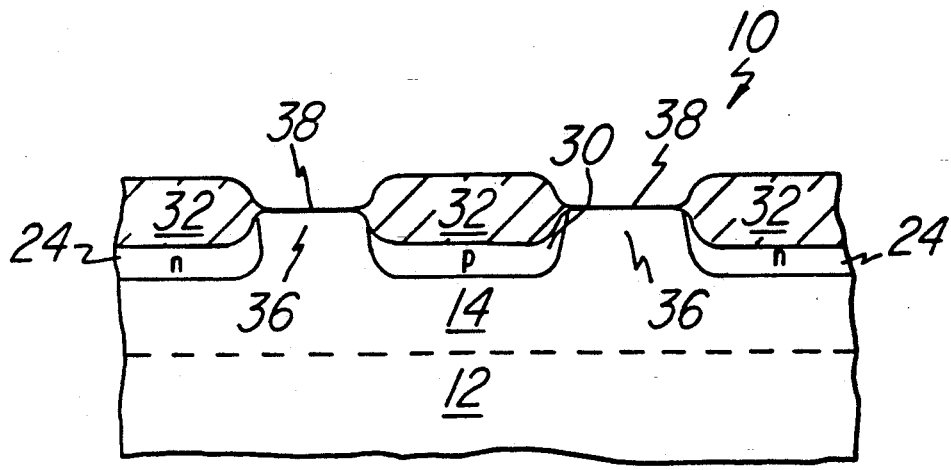

Referring now to FIG. 5, the remaining portions 18a and 18b of the nitride layer are selectively removed. It is noted that a short oxide deglaze is normally required to remove the thin oxide which will have formed on nitride layer 18 prior to stripping the nitride layer by hot phosphoric acid or another selective etch. The thin oxide layers 34 are then removed. The thin oxide layers 34 may be removed by performing a timed wet HF or vapor-phase HF deglaze. The last oxide etch will also remove a fraction of thick oxide 32. Typically, the thick oxide 32 will now be between about 100 Å and 600 Å thick.

Figure 6:
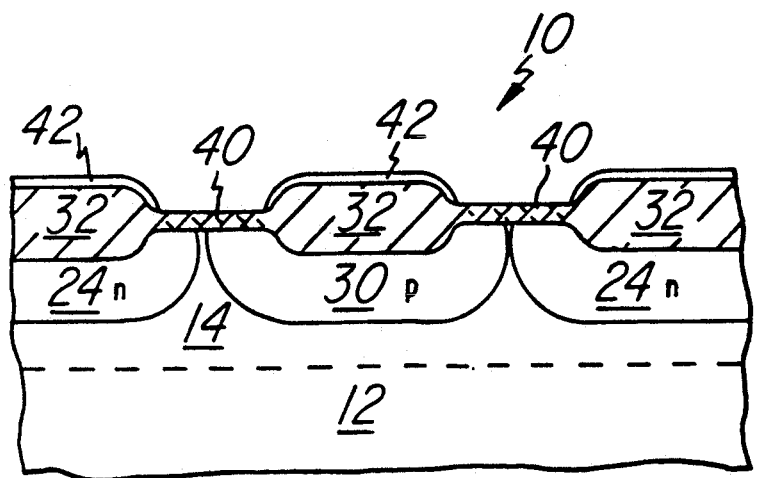

It is noted that well regions 30 and 24 are now covered by oxide layers 32 while separation regions 36 (i.e., the unimplanted region which separates regions 30 from 34) have bare silicon surface 38. These features allow for the ONED and NRD phenomena described earlier to benefit the resulting structure as illustrated in FIG. 6.

Next an RTP or batch furnace well formation anneal is performed in a nitridizing ambient. In the preferred embodiment, an ammonia ambient is used. In the preferred embodiment, the temperature is less than 1150° C. and preferably between about 1050° and 1150° C. The typical anneal times will be less than ten (or possibly five) minutes. This feature provides a throughput advantage, especially in single-wafer processing equipment.

The oxide regions 32 over the doped well regions 24 and 30 will cause significant vertical diffusion enhancement via the ONED effects for boron and phosphorus. However, the exposed silicon surfaces 38 between the well regions 24 and 30 (and over the separation regions 36) will reduce the lateral diffusivities of boron and phosphorus via the NRD effects (direct nitridation of exposed silicon surfaces). The workpiece after the anneal step is illustrated in FIG. 6. Also illustrated in FIG. 6 are the thin (<60 Å) thermal silicon nitride layers 40 which will form on silicon surface 38 as well as the nitroxide layers 42 which are the result of conversion of oxide layers 32 (in FIG. 5) via nitridation.

The result of the anneal step is the formation of N and P wells with reduced lateral dopant compensation and, therefore, improved chip packing density. In other words, due to the limited lateral diffusion, the wells may be spaced more closely together.

Figure 7:
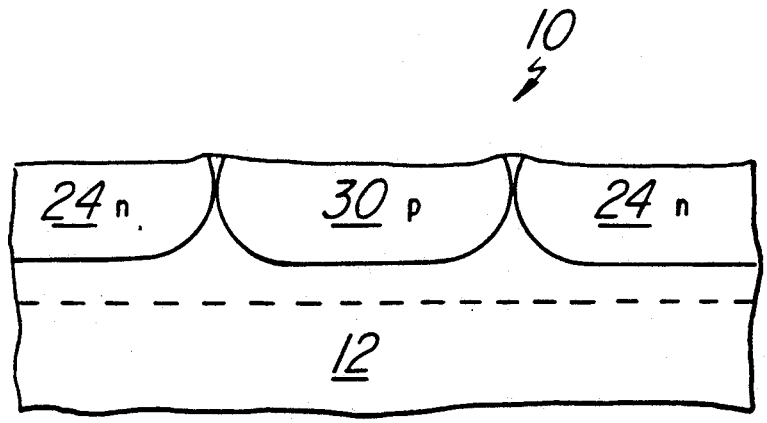

If desired, a short steam oxidation may be performed to consume the nitride regions 40. An oxide deglaze may then be performed to remove regions 32 and 40 from the surface of substrate 14. Alternatively, a single wet etch may be performed to remove the nitroxide and nitride layers. The substrate, illustrated in FIG. 7, is now ready to proceed with the subsequent standard processing steps.

It should be noted that the final topography of semiconductor layer 14 will not be perfectly smooth because of the oxidation of the doped regions 24 and 30 while forming thick oxide layers 32. An alternate embodiment which substantially eliminates this topography problem is illustrated with reference to FIGS. 8 and 9.

Figure 8:
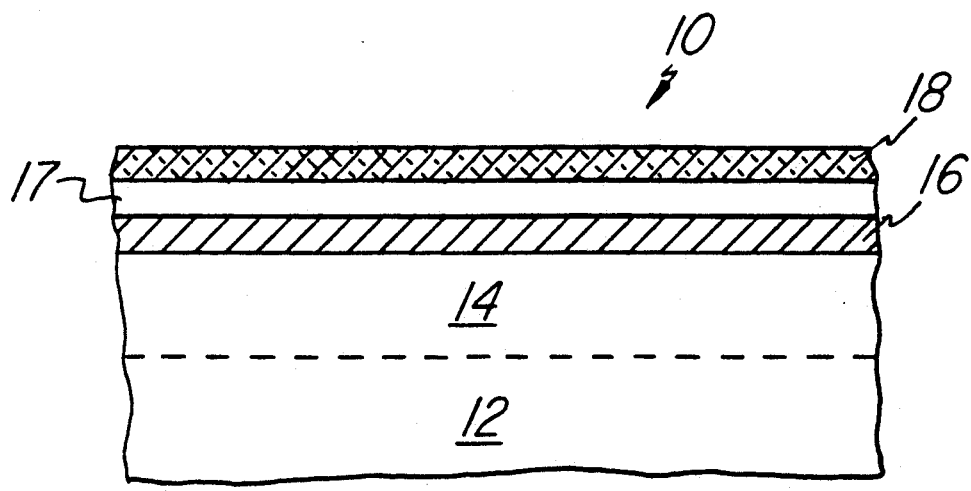
FIGS. 8 and 9 are cross-sectional views of an alternate embodiment device during various stages of the process flow.

FIG. 8 illustrates a polycrystalline or amorphus silicon layer 17 formed between oxide layer 16 and nitride layer 18. The polycrystalline (or amorphous silicon) layer 17 is typically between about 100 Å and 500 Å thick and may be formed by LPCVD. In the preceding example, FIG. 8 would replace FIG. 1 for the alternate embodiment.

Figure 9:
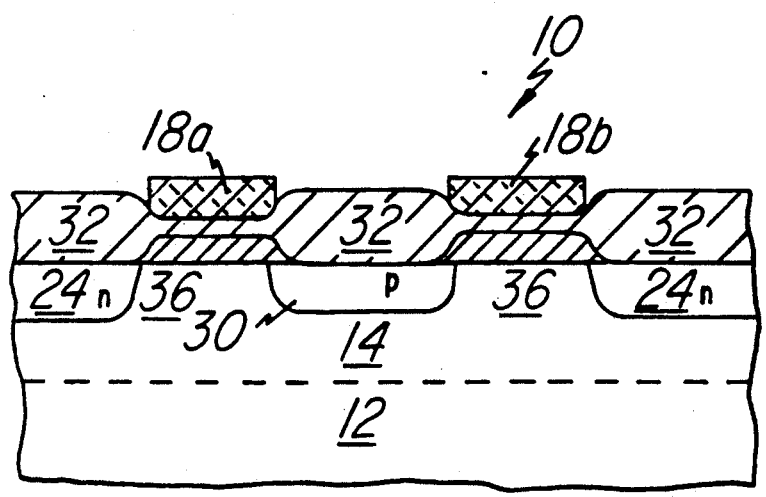

The process flow of the alternate embodiment would continue substantially like that of the preferred embodiment as illustrated in FIGS. 2 through 5. In the alternate embodiment, however, the thick oxide regions 32 will be formed by oxidation of polycrystalline or amorphous silicon layer 17 rather than portions of semiconductor layer 14. This variation is shown in FIG. 9 (which is similar to FIG. 6 discussed above). Since the silicon substrate 14 is not oxidized, when the oxide is removed as discussed with reference to FIG. 7, the substrate will remain substantially unchanged. Therefore, these additional steps will avoid any topography issues with the final substrate and will result in a planar structure.

The substrate 10 which includes N-well regions 24 and P-well regions 30 may be used in a great number of applications. It is noted that the application in which the substrate 10 is used is not critical to this invention.

Figure 10:
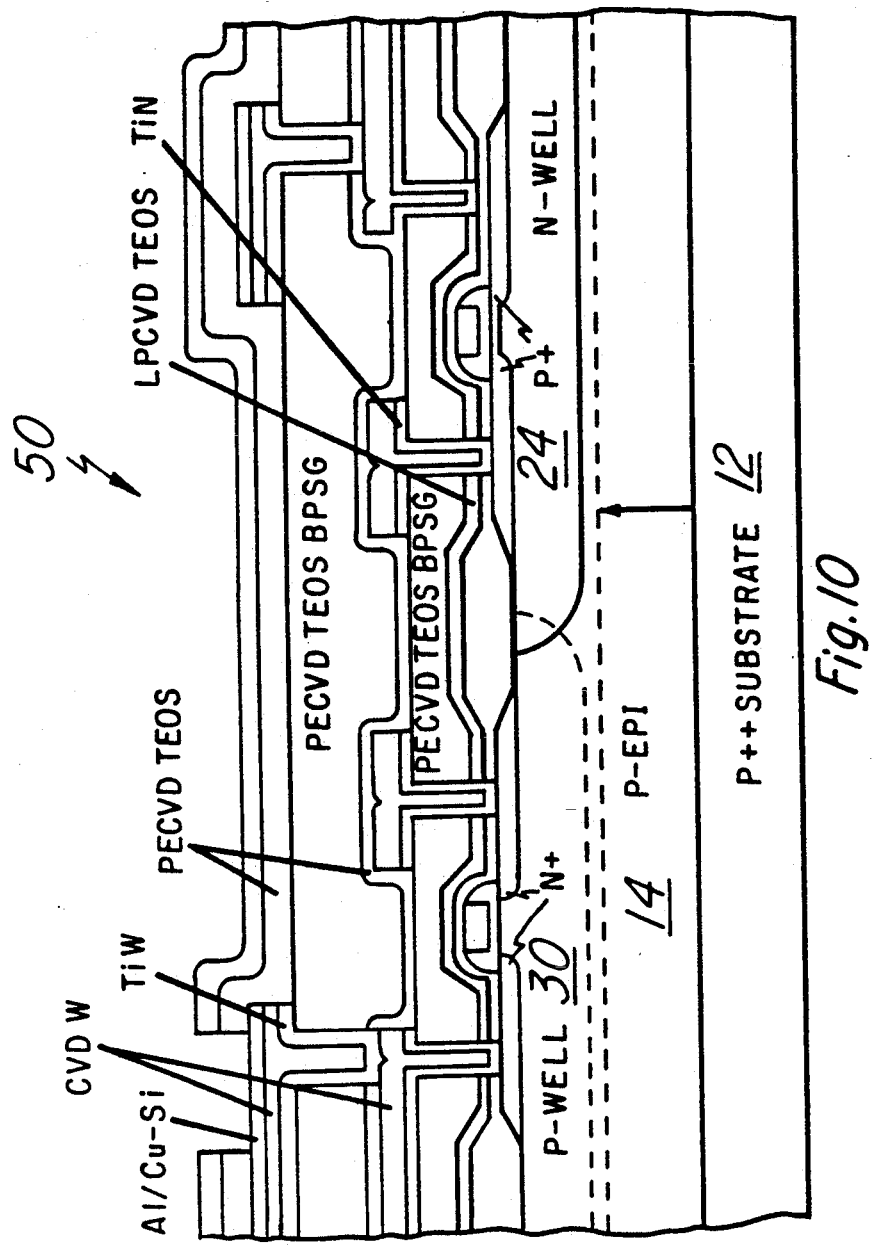
FIG. 10 is a cross-sectional view of an exemplary CMOS technology which can utilize the well structure and method of the present invention.

Referring now to FIG. 10, a cross-section of one exemplary CMOS device 50 is illustrated. The CMOS device 50 includes P-well region 30 and N-well region 24 and is included herein to illustrate one of the many possible applications of the process of present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A method of forming a doped well in a semiconductor layer comprising the steps of:

forming a first doped well region in said semiconductor layer adjacent a separation region;

forming a resist layer over a portion of said semiconductor layer including said first doped well region and said separation region;

forming a second doped well region in said semiconductor layer and aligned with said resist layer, said second doped well region spaced from said first doped well region by said separation region;

removing said resist layer;

forming an oxide layer over said first and second doped well regions but not over said separation region such that an upper surface of said separation region comprises an exposed semiconductor surface; and heating said semiconductor layer in a nitridizing environment such that dopants in said doped well region diffuse vertically at a higher rate than said dopants diffuse laterally.

2. The method of claim 1 wherein said nitridizing environment comprises an environment with an ammonia ambient.

3. The method of claim 2 wherein said heating step comprises heating to a temperature less than about 1150° C.

4. The method of claim 3 wherein said heating step comprises heating for a period of less than ten minutes.

5. The method of claim 4 wherein said semiconductor layer comprises silicon and said oxide layer comprises silicon dioxide.

6. The method of claim 1 wherein said dopants are chosen from the group consisting of phosphorus and boron.

7. The method of claim 1 wherein said semiconductor layer comprises an epitaxially grown semiconductor layer.

8. A method of forming doped wells in a silicon layer comprising the steps of:

forming an oxide layer on the surface of said silicon layer;

forming a nitride layer on said oxide layer;

patterning and etching said nitride layer to define a first well region;

doping said first well region;

forming a resist layer over said first well region and over a portion of said nitride layer;

removing a portion of said nitride layer not beneath said resist layer such that a second well region is exposed;

doping said second well region;

removing the remaining portion of said resist layer;

forming a thick oxide layer over said first and second well regions and forming a bare silicon surface over a separation region between said first and second well regions; and heating said silicon layer in a nitridizing environment such that dopants diffuse into said silicon layer.

9. The method of claim 8 wherein said nitridizing environment comprises an environment with an ammonia ambient.

10. The method of claim 8 wherein said heating step comprises heating to a temperature less than about 1150° C.

11. The method of claim 8 wherein said heating step comprises heating for a period of less than ten minutes.

12. The method of claim 11 wherein said first well region comprises a region doped with phosphorus.

13. The method of claim 12 wherein said second well region comprises a region doped with boron.

14. The method of claim 8 wherein said silicon layer comprises an epitaxially grown silicon layer.

15. The method of claim 14 wherein said oxide layers are formed by thermal oxidation.

16. The method of claim 8 wherein said first well region is doped with N-type impurities and said second well region is doped with P-type impurities.

17. The method of claim 8 and further comprising forming a silicon layer over said oxide layer such that said step of forming a thick oxide comprises the step of thermally oxidizing said silicon layer.

18. The method of claim 17 wherein said silicon layer comprises an amorphous silicon layer.

19. The method of claim 17 wherein said silicon layer comprises a polycrystalline silicon layer.

* * * * *